United States Patent [19]
Saito et al.

[11] Patent Number: 5,343,425
[45] Date of Patent: Aug. 30, 1994

[54] SEMICONDUCTOR VIDEO MEMORY HAVING MULTI-PORTS

[75] Inventors: Shozo Saito; Haruki Toda, both of Yokohama, Japan

[73] Assignee: Kabushiki Kaisha Toshiba, Kawasaki, Japan

[21] Appl. No.: 25,564

[22] Filed: Mar. 3, 1993

[30] Foreign Application Priority Data

Mar. 30, 1992 [JP] Japan .................................. 4-074642

[51] Int. Cl.$^5$ .............................................. G11C 19/28
[52] U.S. Cl. ........................ 365/189.01; 365/230.03; 365/230.09; 365/233; 365/230.05
[58] Field of Search ........................ 365/230.03, 230.05, 365/230.09, 219, 220, 221, 233, 236

[56] References Cited

U.S. PATENT DOCUMENTS 4,644,502 2/1987 Kawashima .......................... 365/219
5,206,834 4/1993 Okitaka et al. .................. 365/230.03

FOREIGN PATENT DOCUMENTS 0319432 6/1989 European Pat. Off. .
0474245 3/1992 European Pat. Off. .

OTHER PUBLICATIONS

Bursky, "Integrated Cached Dram Lets Data Flow at 100 MHz", *Electronic Design*, vol. 40, No. 4, pp. 142, 146 (Feb. 1992).

Primary Examiner—Eugene R. LaRoche
Assistant Examiner—Vu Le
Attorney, Agent, or Firm—Foley & Lardner

[57] ABSTRACT

A semiconductor memory device has a memory cell array including many memory cells, a first data I/O section for implementing random input and output of data for the memory cells based on an externally-supplied random I/O signal, a second data I/O section for implementing serial input and output of data for the memory cells, a counter for counting the number of externally-supplied basic clock signal cycles, a controller for controlling the I/O of data for the memory cells in accordance with the number of the cycles of basic clock signals. The counter is capable of inputting at least one kind of externally-supplied designation signals, generating a designation control signal for designating a specified cycle which is a count starting cycle for the basic clock signal at each designation signals, generating instructions for commencement of count for the number of cycles of the basic clock signal in the counter based on the designated control signal, and synchronously controlling designation of addresses based on the number of cycles counted by the counter and the I/O operations of the first data I/O means and the second data I/O means from the specified cycle of the designated basic clock signal.

5 Claims, 8 Drawing Sheets

SEMICONDUCTOR VIDEO MEMORY HAVING MULTI-PORTS

BACKGROUND OF THE INVENTION

1. Field of the Invention

The present invention relates to an application specific semiconductor memory device having multi-ports for graphics application, for example, and, in particular, to a semiconductor memory device having a random access port and a serial access port for storing graphics data, for high speed input and output operations synchronized with a clock signal.

2. Description of the Prior Art

Figure 1:
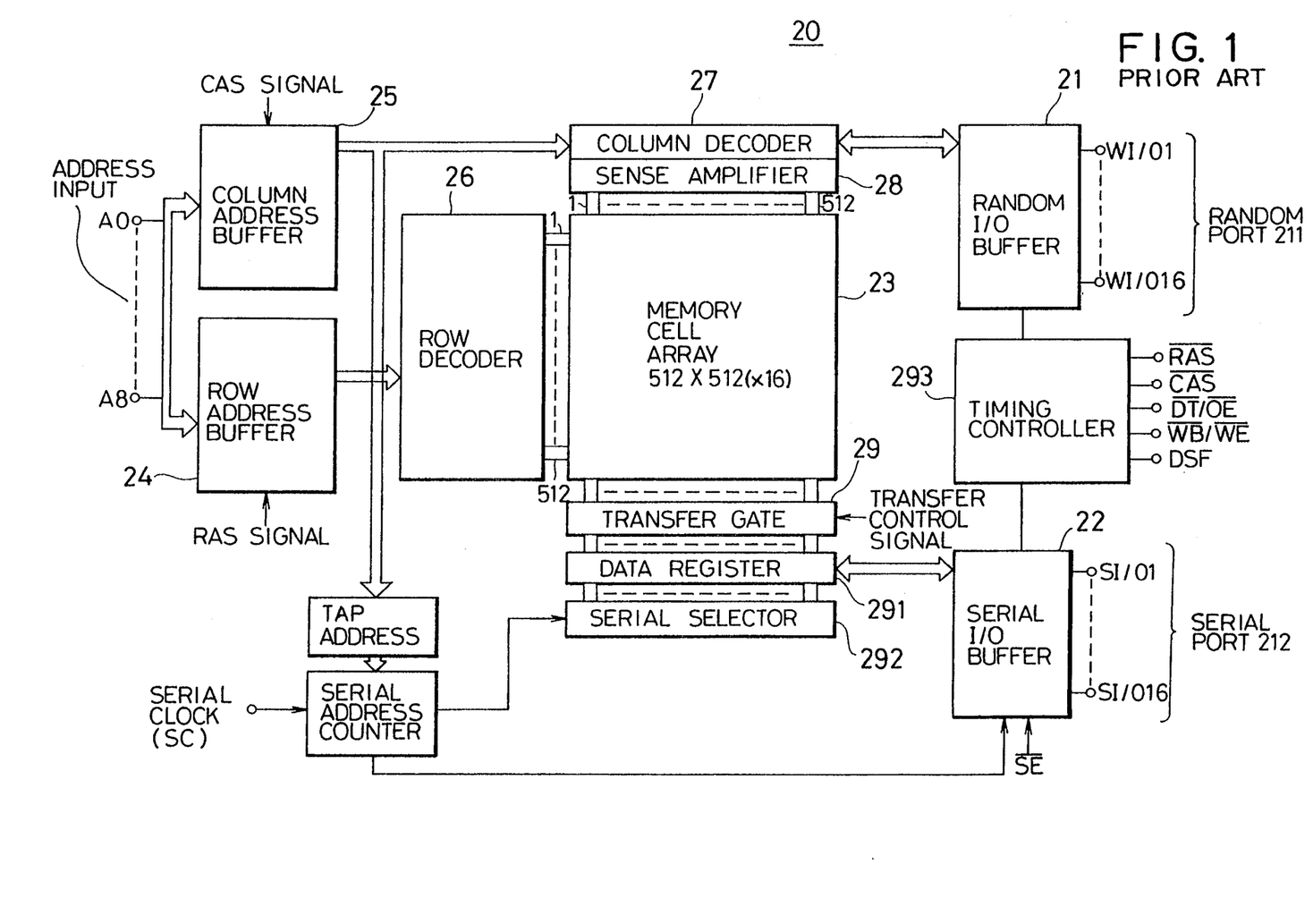
FIG. 1 is a view showing the configuration and operation of a conventional circuit block of a multiport video memory (VRAM).

FIG. 1 is a block diagram illustrating a multiport VRAM, for example, a multiport video memory (VRAM) 20 which is one type of conventional multiport semiconductor memory device used for storing graphics data. Normally, as shown in the drawing, two ports are provided, specifically, a random access (RAM) port and a serial access (SAM) port. The RAM port is connected with a processor (omitted from the drawing) via a data bus for exchanging computing data with a memory cell array 23 in the same manner as for a conventional standard DRAM.

The SAM port outputs graphics data transmitted from the memory cell array 23 to a RAMDAC (omitted from the drawing), converts this data to an RGB analogue video signal, and displays this signal on a display device.

The RAM port is mainly used for high speed transmission of data to the CPU in the above manner.

The SAM port, on the other hand, is mainly used for transmission of display data to the display device. In addition, the VRAM 20 has the exclusive function for operating a write per bit (writing operation per bit), block-write (writing operation per block), flash-write (writing operation per row address), RAM-SAM (read, write, sprite) transfer operation, and the like to provide high speed image processing. The use of this type of memory makes it possible to provide a graphic system with a significantly improved performance as compared with the case of a conventional standard DRAM with a single port.

However, there has recently been a conspicuous improvement in the performance of computer systems, particularly in the field of work station applications.

There are strong requirements for improvement of the performance of the VRAMs applied in this field, and for provision of large volume memory. However, there are many problem areas existing at the present time which must be improved to achieve these requirements.

Examples are as follows:

(1) The upper limit to the access speed through the RAM port in VRAM is 60 to 70 ns and the cycle time ranges from 100 to 120 ns, the same as the performance of a standard DRAM. Also, a page mode operation function is used for a high speed cycle time, but in such a case as well the upper limit to the cycle time is 40 to 50 ns.

(2) The upper limit to the speed through the SAM port in VRAM is 20 to 30 ns, which differs from the display rate. Accordingly, at the present time high speed is attained by arranging several devices in parallel and converting the outputs from parallel to series. However, it is not possible to increase the number of bits connected to one I/O port in order to preset the number of bits in the display. There is therefore no way of obtaining large volume other than by increasing the number of I/O ports. Accordingly, at the present time the I/O ports are allotted in the direction of the plane in the graphic display.

(3) The increase in the number of I/O ports is limited to the number of pins in a package. When an I/O port comprises 16 bits, two ports require 32 I/O pins. A total of 64 pins is therefore necessary for the two ports, addressing pins and control pins. The 64 pins are maximum number under present packaging technology for a reasonable packaging size.

(4) Increasing the number of I/O ports causes an increase in output noise. It is therefore difficult to provide an I/O port of more than 32 bits because two I/O ports are made up of 64 I/O pins. This is a problem.

(5) Because the two ports, specifically the RAM port and the SAM port, operate asynchronously, it is difficult to avoid the effects of operating noise generated inside the VRAM and of output noise generated by many I/O pins.

For this reason, it is difficult to attain a further increase in bit capacity and high speed operation. There are many such difficulties related to the areas of increased capacity and speed of present VRAMs. Therefore, future application development faces those kinds of problem.

SUMMARY OF THE INVENTION

Accordingly, an object of the present invention is to provide, with due consideration to the drawbacks of such conventional devices, a semiconductor memory device wherein the problems associated with a conventional semiconductor memory device are eliminated. Specifically, for example, an object of the present invention is to provide a semiconductor memory device for storing graphics data which is suitable for large volume image processing, equipped with a RAM port and a SAM port through which high speed memory access is possible, by adopting a circuit configuration and a control method synchronized with an external clock signal.

The scope of the present invention is directed to a semiconductor memory device, having a memory cell array arranged in the form of a matrix comprising a plurality of memory cells;

a first data input/output (I/O) means for implementing random input and output of data for the memory cell based on an externally-supplied random I/O signal;

second data I/O means for implementing serial input and output of data for the memory cell;

counter means for counting the number of externally-supplied basic clock signal cycles; and control means for controlling the I/O of data for the memory cell in accordance with the number of the cycles of basic clock signal, inputting at least one kind of externally-supplied designation signal, generating a designation control signal for designating a specified cycle which is a count starting cycle for the basic clock signal at each designation signal, generating instructions for commencement of count for the number of cycles of the basic clock signal in the counter means based on the designated control signal, and synchronously controlling designation of addresses based on the number of cycles of the basic clock signal counted by the counter means and the I/O operations of the first data I/O means and the second data I/O means from the specified cycle of the designated basic clock signal.

In another preferred embodiment of the present invention, a semiconductor memory device, includes
- a memory cell array arranged in the form of a matrix comprising a plurality of memory cells;
- an address designation means for selecting a specified memory cell from within the memory cell array;
- a first data input/output (I/O) means for executing random input and output of data for the memory cell designated by the address designation means based on an externally-supplied random I/O control signal;
- a first I/O port for random input and output between data in the first data I/O means and external data, performing in synchronism with an externally-supplied, continuous, basic clock signal;
- a serial data register for temporarily storing the data to input and output the data for the memory cell array;
- transfer means for transferring the data in the memory cell array designated by the address designation means to the serial data register, based on an externally-supplied serial transmission control signal;
- second data I/O means for executing serial input and output of data in the serial data register;
- a second I/O port for serial input and output between data in the second data I/O means and external data, performing in synchronism with the basic clock signal;
- counter means for counting the number of basic clock signal cycles; and
- control means for controlling the I/O of data for the memory cell in accordance with the number of the cycles of basic clock signal,
- inputting at least one kind of externally-supplied designation signal,
- generating a designation control signal for designating a specified cycle which is a count starting cycle for the basic clock signal at each designation signal,
- generating instructions for start of count for the number of cycles of the basic clock signal in the counter means based on the designated control signal, and
- synchronously controlling designation of addresses by the address designation means based on the number of cycles calculated by the counter means and the I/O operations of the first and second data I/O means from the specified cycle of the designated basic clock signal.

In a preferred embodiment, a semiconductor memory device for storing graphics data as claimed described above, wherein the memory cell array is divided into a plurality of banks, each bank comprising a plurality of memory cells;
- each of the banks comprises a serial data register and a second data I/O means; and
- the control means has the function for switching the banks so that while one bank is undergoing an I/O operation, another bank is being precharged, and, in addition, of controlling so that a split transmission of data I/O is carried out between banks.

In another preferred embodiment of the present invention, a semiconductor memory device as claimed described above, wherein
- the basic clock signal is formed from two types of clock signals; and
- the control means has the function of controlling so that the first I/O port is operated in synchronism with one clock signal, and the second I/O port is operated in synchronism with another clock signal.

These and other objects, features, and advantages of the present invention will become more apparent from the following description of the preferred embodiments taken in conjunction with the accompanying drawings.

DETAILED DESCRIPTION OF THE PREFERRED EMBODIMENTS

First, the basic features of the present invention will be described, and then the preferred embodiment of the present invention will be explained.

In the semiconductor memory device according to the present invention, the data I/O operations of both a first data I/O means and a second I/O means are controlled by synchronization with an externally supplied basic clock signal, and can, for example, provide alternate bank operation to implement continuous data I/O. Split transmission can also be implemented between the banks, for example, so that a high speed I/O operation can be provided.

Other features of this invention will become apparent in the course of the following description of exemplary embodiments which are given for illustration of the invention and are not intended to be limiting thereof.

A first embodiment of the present invention will now be described with reference to the drawings.

First, in order to clear the differences between an embodiment of the present invention and a conventional semiconductor memory device, an explanation will be given, with reference to FIG. 1, of the operation of a conventional multiport video memory (VRAM).

The VRAM 20 shown in the drawing illustrates the case of a 256 k word×16 bit RAM and a 512 word×16 bit SAM. The VRAM 20 comprises 16-plane memory cell arrays each of which has 512 rows and 512 columns, and a row address and a column address are input to the VRAM 20 from a pair of a row address buffer 24, and a column address buffer 25 in accordance with a string of address signals provided from an external source (CPU or graphics controller).

These addresses are written into a specific bit of data from within a cell array 23 by inputting to a pair of decoders 26, 27 and the data is read out. The read-out data from the memory cell array 23 is latched in a sense amplifier 28 by each column unit, and only data selected by the column decoder 27 is output from a random I/O buffer 21. The operation in the case of the write-in of the I/O data is exactly the same. These read-out and write-in operations are controlled by an RAS, a CAS, and a WE signal in the same manner as in a conventional DRAM. Output is enabled by an OE signal.

In a SAM port 212, one row of data selected from a row address passes through a transfer gate 29 and is transmitted to a data register 291 by means of a transmission control signal, and is output from a serial address I/O buffer 22 to outside of the VRAM 20 based on successive serial clock signals from the starting address (top address) designated by the column address. Here a serial selector 292 has the function of a pointer which accesses the successive data registers, starting from the top address.

Data transmission is controlled by a DT (Data Transfer) signal and a DSF signal input to a timing controller 293. In addition, serial output is enabled by an SE (Serial Output Enable) signal input to the SAM port 212.

The special features of the conventional VRAM 20, as shown in FIG. 1, are that a RAM port 211 is controlled from RAS/CAS signals, the SAM port 212 is controlled from serial clock signals, and these are operated alternately and completely independently, except for the transmission operation and the address input operation.

Figure 2:
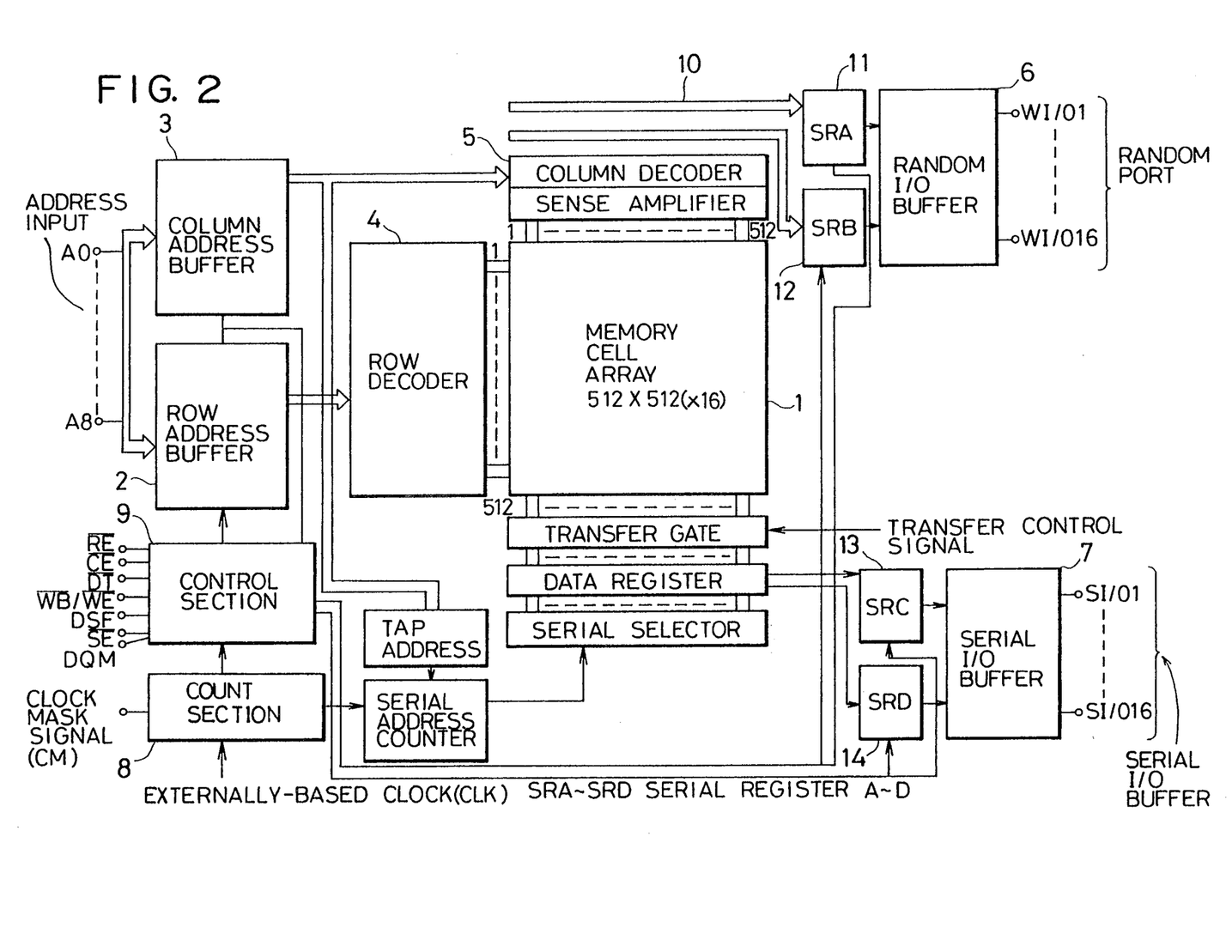
FIG. 2 is a view showing the configuration of a first embodiment of a semiconductor memory device of the present invention.

FIG. 2 is a block diagram for a first embodiment of a multiport semiconductor memory device 10 of the present invention.

In the drawing, a memory cell array 1, a row address buffer 2 and a column address buffer 3, a row address decoder 4 and a column address decoder 5 (address designating means), and a random I/O buffer 6 and a serial I/O buffer 7 (first and second I/O means) are the same as the equivalent structural elements of the conventional example of FIG. 1.

The special features of the present invention are the structure comprising an externally-based clock, a counting section (counter means), and a control section (control means) and the control method.

Specifically, a counting section 8 is a counter for counting the number of cycles of an externally-based clock signal (referred to as a CLK signal or a basic clock signal) which is input in an almost continuous fixed cycle.

The counter 8 has the function of distinguishing between a specific clock cycle in a series and other clock cycles. A control section 9 controls the operating state (when an address is input, read-out/written-in) of the memory 10 based on an externally-provided control signal.

A signal (RAS) is input to designate a specific cycle of the CLK signal: the specific cycle of the CLK signal is designated for activation of the respective signals; and the count of the CLK signals is started in the counting section 8.

Data selected by the column address decoder 5 is bundled into 4-bit or 8-bit units, transmitted to two serial registers 11, 12 (SRA, SRB), and is input/output through a random access port at a high-speed cycle time through the random I/O buffer 6. The reason for the two serial registers 11, 12 is to make possible continuous random access exceeding the bit length of a register.

Accordingly, by using the two serial registers 11, 12 together it is possible to implement the continuous reading/writing of one row (one page) of data.

In the same manner, a serial data section also transmits data temporarily from a data register to two serial registers 13, 14. By using the serial registers 13, 14 together it is possible to provide high-speed input and output of data by means of the serial access port via the serial I/O buffer 7.

Next, the operation of the semiconductor memory device as a preferred embodiment according to the present invention shown in FIG. 2 will be explained with reference to the timing diagrams shown in FIG. 3 and FIG. 4.

Figure 3:
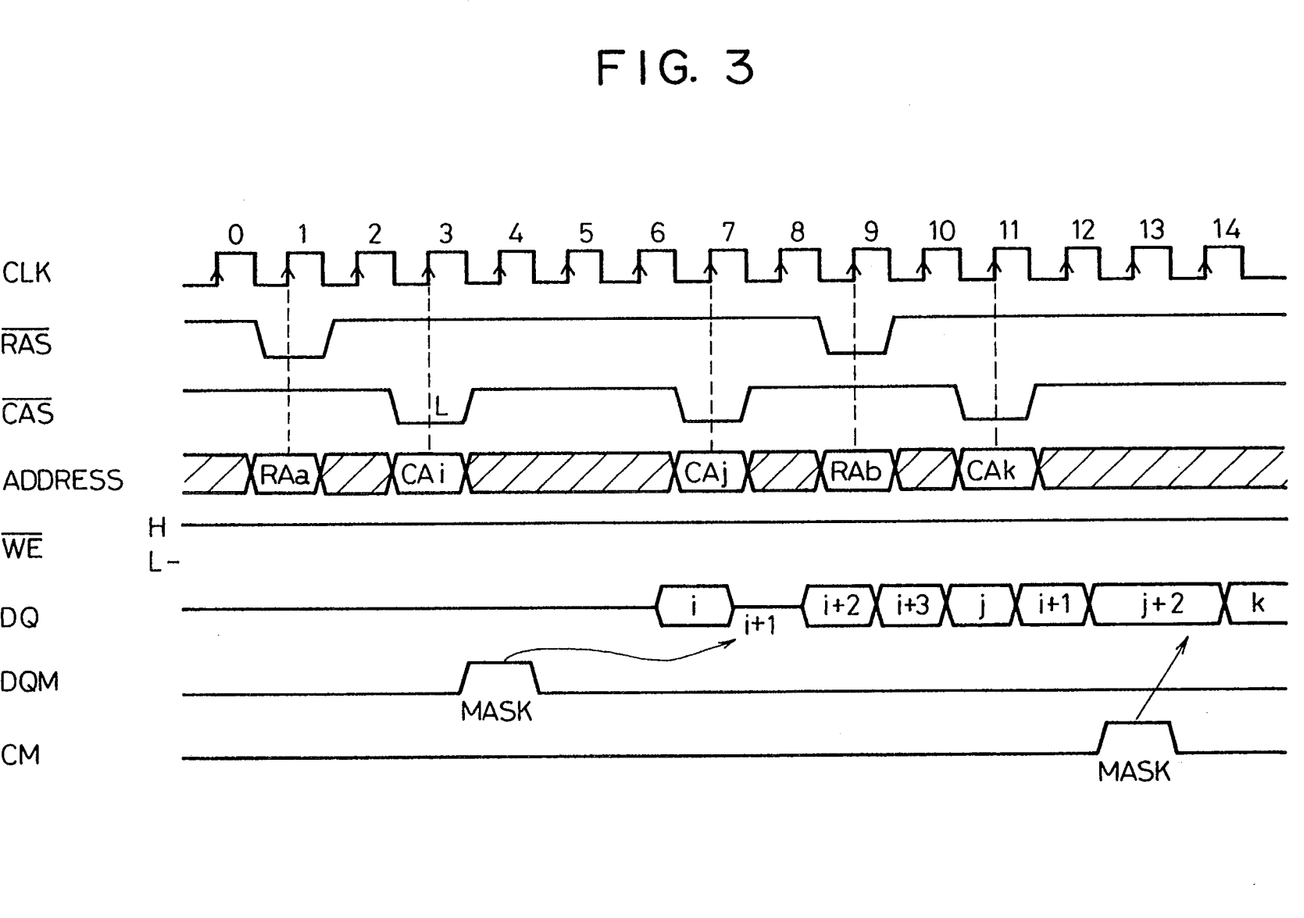
FIG. 3 is a timing chart showing the timing of a read-out operation of the semiconductor memory device illustrated in FIG. 2.

FIG. 3 is a timing chart showing the timing of the read-out of the semiconductor memory device of this embodiment, illustrated in FIG. 2.

A signal /WE (Write Enable) is normally set at high level.

Figure 4:
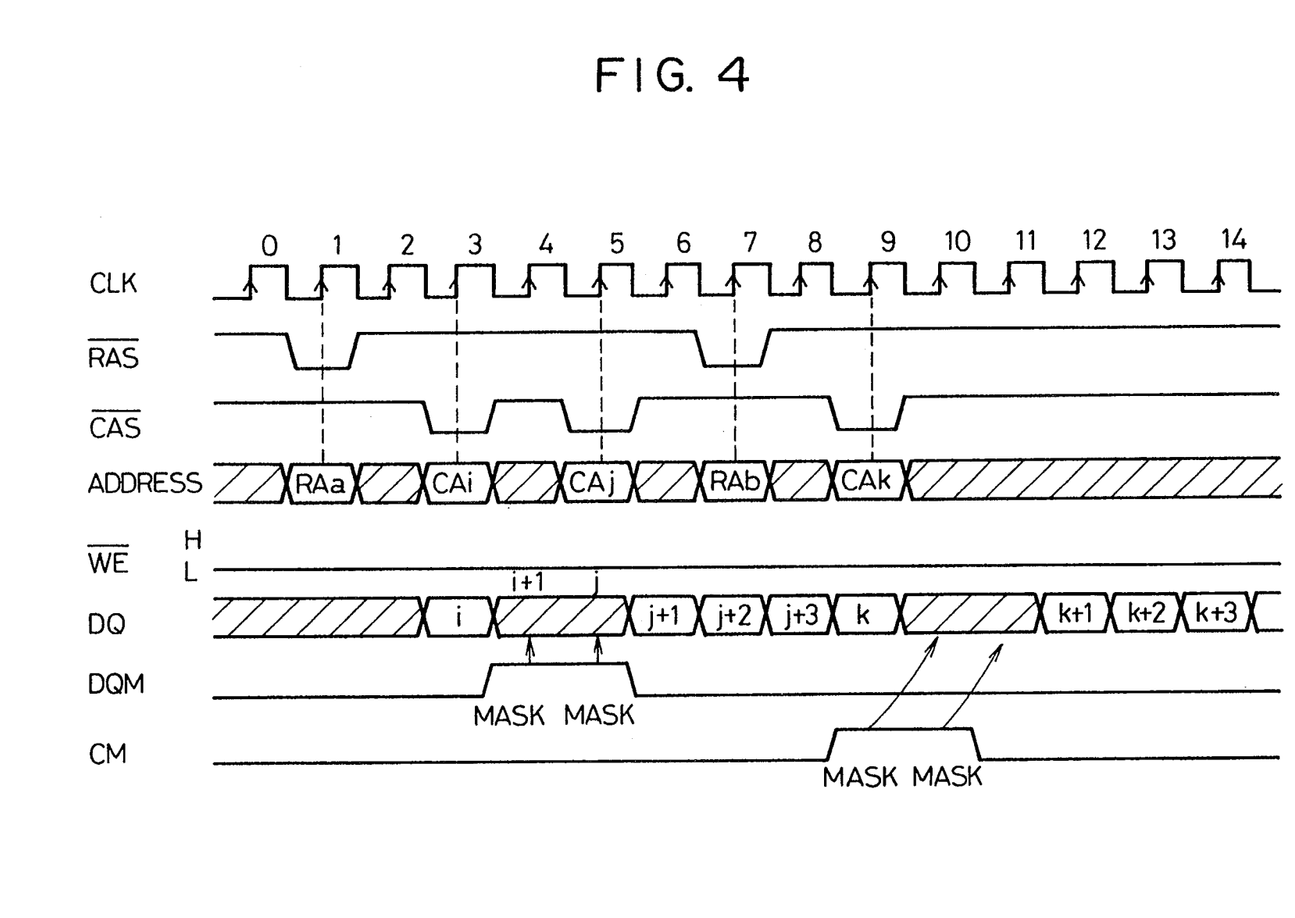
FIG. 4 is a timing chart showing the timing of a write-in operation for the semiconductor memory device illustrated in FIG. 2.

The character "CLK" shown in FIGS. 3 and 4 indicates the basic clock signal.

CLK1 is determined when the first CLK signal is raised after the fall of an /RAS signal. At this time a row address RAa is input.

Next, during a basic clock signal CLK3, specifically, with a /CAS signal at low level, a column address CAi is input.

After this, data is output serially at each subsequent clock signal following CLK6 which is the fourth cycle.

In addition, a new column address CAj is input at the seventh cycle (CLK7), and serial data is output from the tenth cycle (CLK10).

Also, a signal DQM is a mask for data I/O, and because the column address is masked at i+1, the output data becomes Hi-Z state at i+1.

Furthermore, CM is a clock mask, and the clock input is disregarded at a signal which halts an internal clock counter in the next cycle at which this signal is input.

FIG. 4 is a timing chart showing the timing of the write-in.

A signal /WE is normally set at low level. The input of an address signal is the same as for the case of a read-out, but the input of the input data is different from the case of the read-out. In the write-in case, the input data is input in the same cycle as the column address.

Also, DQM is an input mask which masks the input data for the same cycle. In the same manner, a signal CM is a clock mask.

The operation of the next cycle is disregarded, and the internal operation is skipped.

Also, it is impossible to have a mixture of the write-in and the read-out in the same column cycle but after changing the column address it is possible to mix them in the same row cycle.

Figure 5:
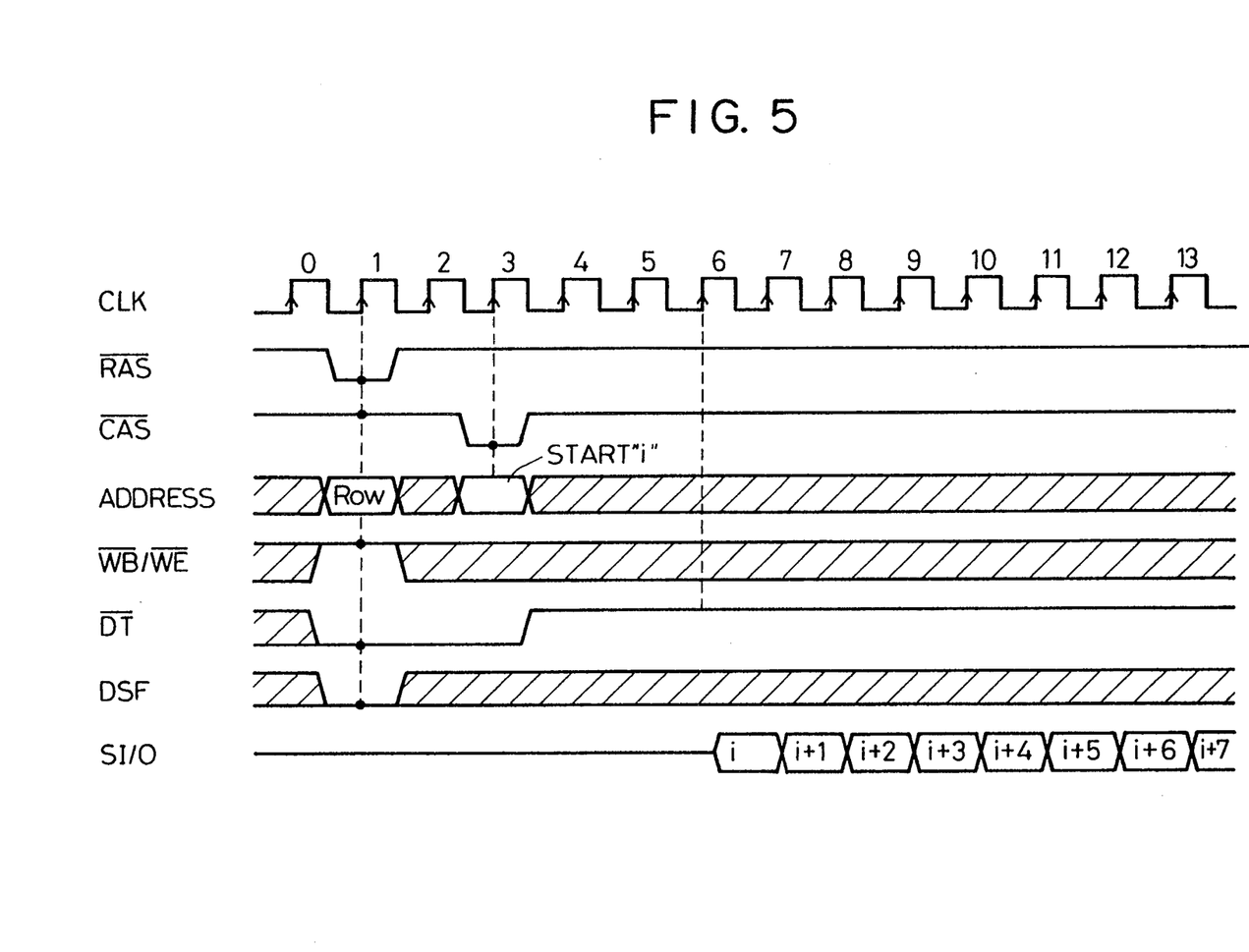
FIG. 5 is a timing chart showing the read-out timing of a SAM port for the semiconductor memory device illustrated in FIG. 2.

FIG. 5 is a timing chart showing the read-out timing of the SAM port.

First, in the same manner as for the RAM port, a row address Row is input at the first CLK signal (CLK1) after the fall of the /RAS signal, and the SAM starting address (top address) is input at the CLK signal CLK3.

Next, data from a row selected in the memory cell array is transmitted to the data register at the rising of a data transmission control signal /DT, and serial access data is sequentially output from the starting address i of the SAM section.

Figure 6:
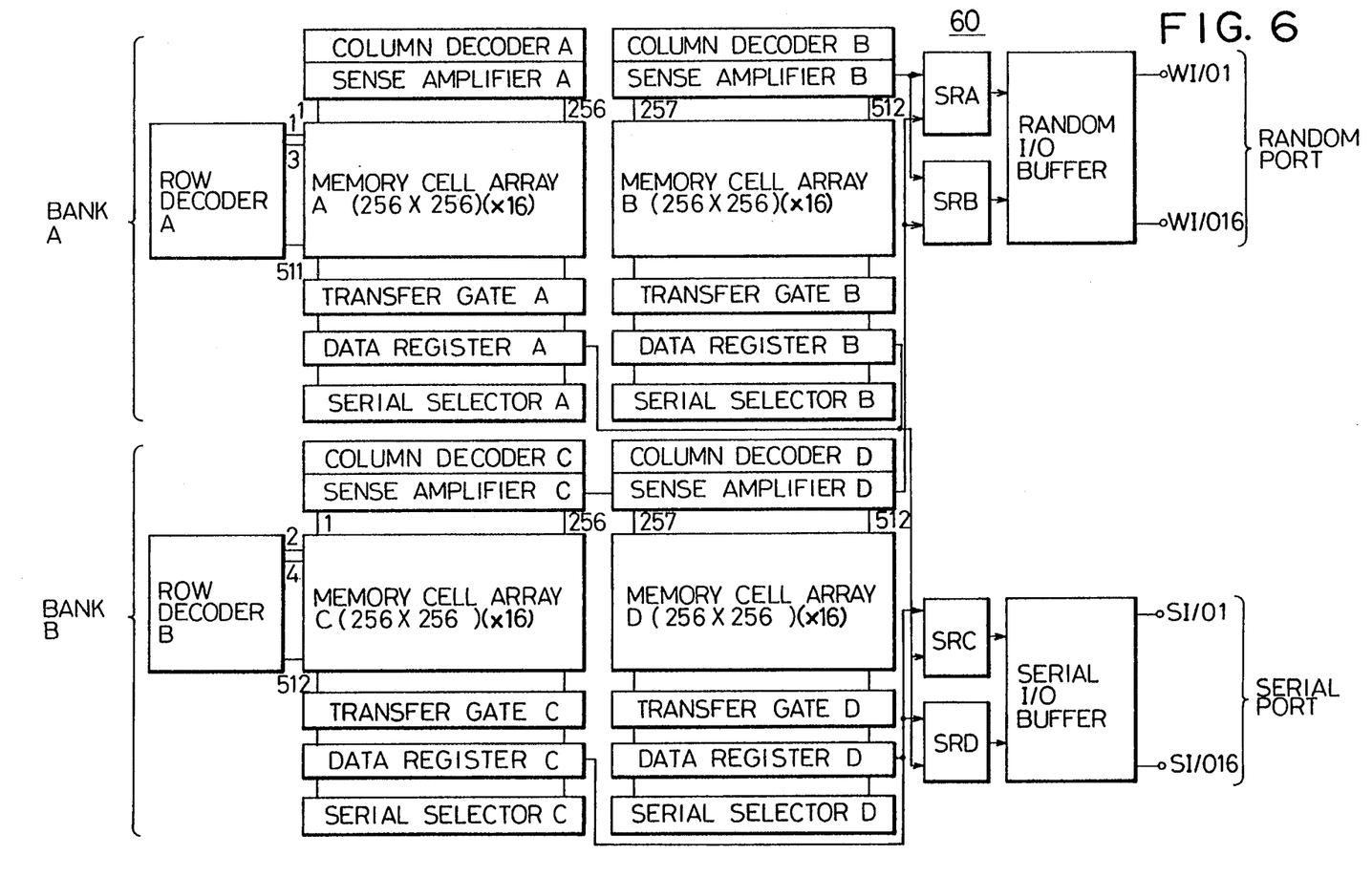
FIG. 6 is a view of the configuration of another embodiment of a semiconductor memory device of the present invention to which bank switching and split transmission functions have been added.

Another embodiment of the present invention will now be explained with reference to FIG. 6.

In this embodiment, the memory cell array is divided into four parts. Specifically, it is divided into two parts in the row direction, a bank A and a bank B, and into two parts in the column direction which are used for split transmission.

The switching of the banks will now be explained with reference to the timing chart shown in FIG. 7.

First, a row address 0 enters the low level at the basic clock signal CLK1 and the bank A is accessed. At this time the bank B is in the precharge mode in the stand-by state.

Next, at the CLK7 the row address 0 enters the low level and the bank B is accessed. At this time the bank A is in the precharge mode in the stand-by state.

By alternately accessing the banks A and B in this manner it is possible to delete seemingly the precharge cycle.

Figure 7:
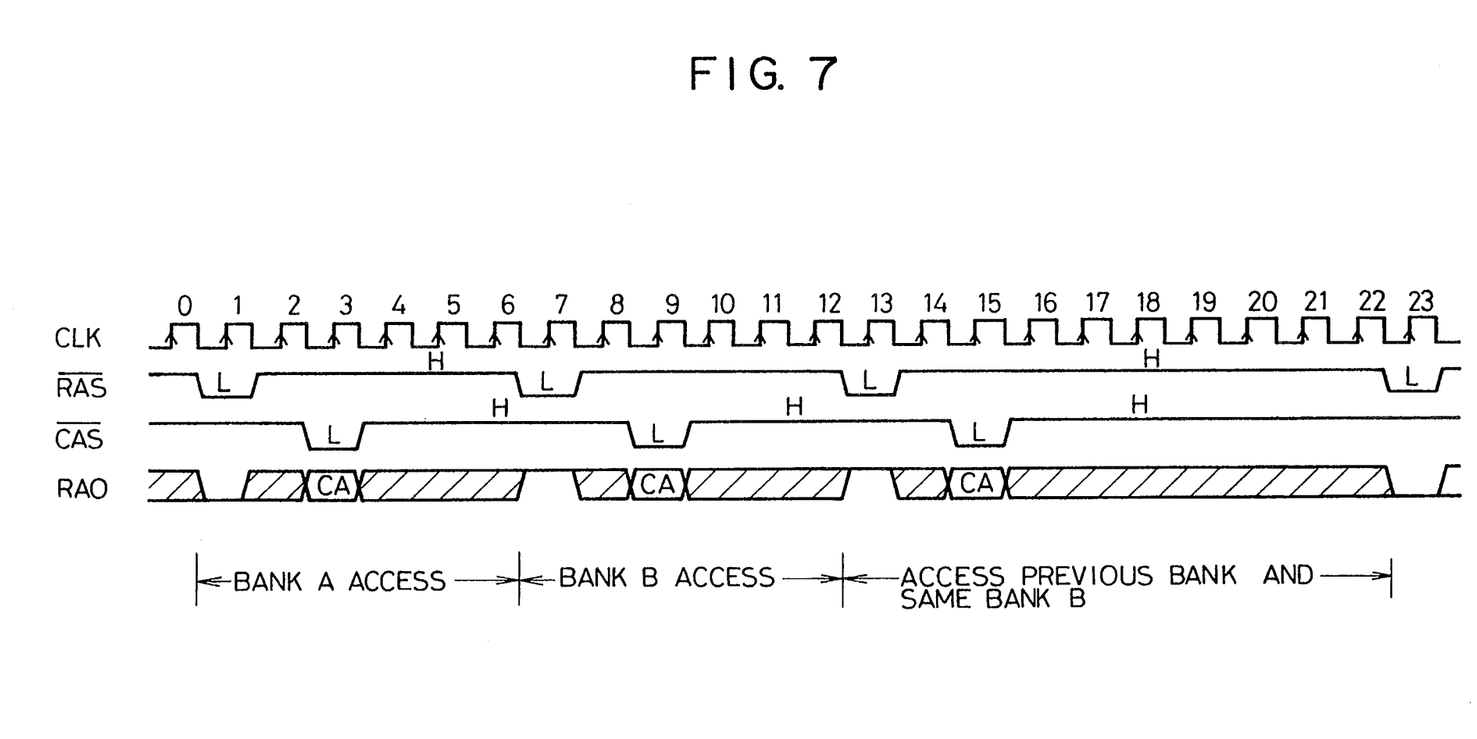
FIG. 7 is a timing chart showing the timing of a bank-switching operation for the embodiment of the semiconductor memory device illustrated in FIG. 6.

However, when same bank is accessed twice, for example, in the case of CLK13 of FIG. 7, the memory enters the precharge cycle and once again enters access mode so that there is a delay until the output data is output, and the number of cycles is increased.

Figure 8:
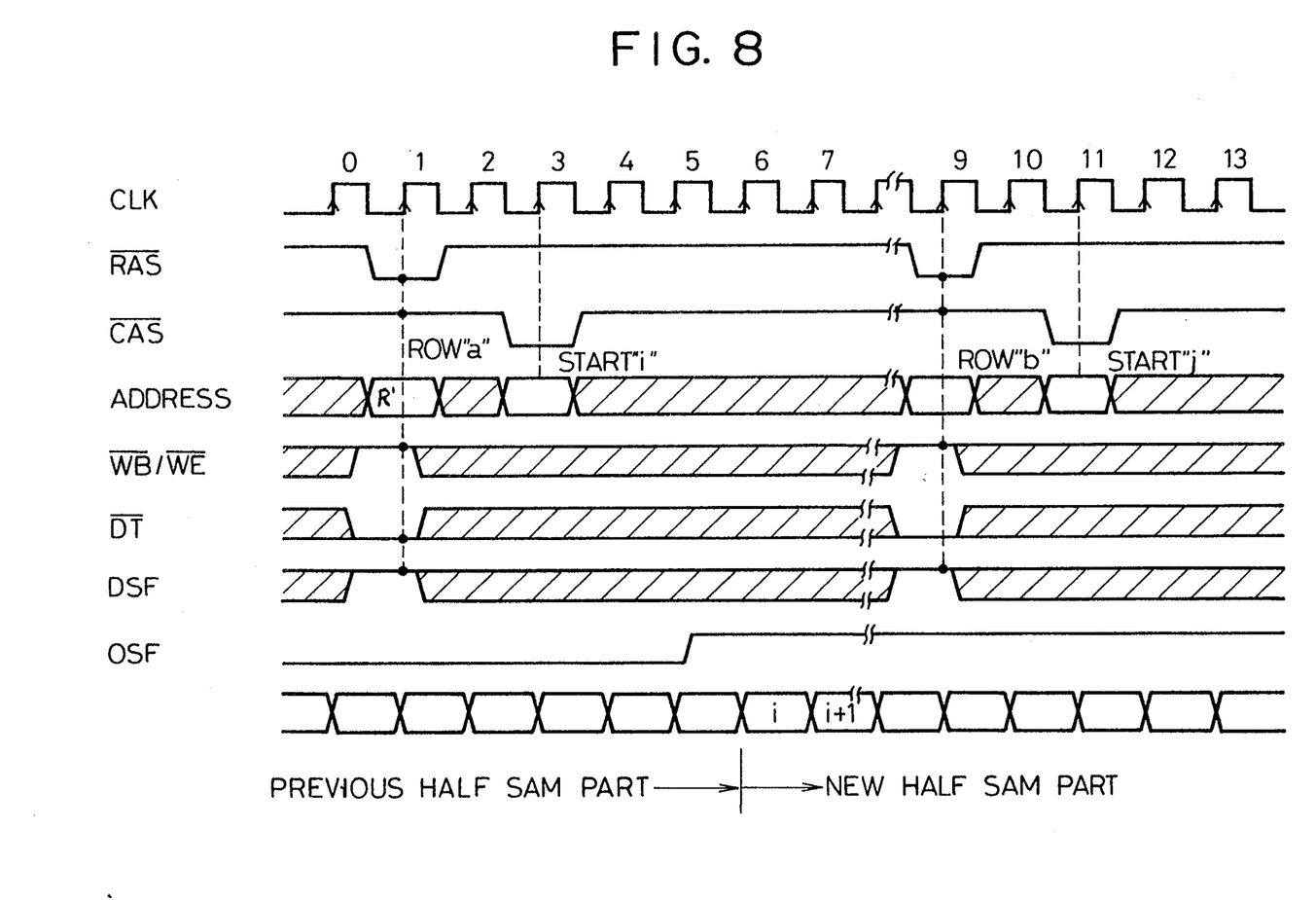
FIG. 8 is a timing chart showing the timing of a split-transmission operation for the embodiment of the semiconductor memory device illustrated in FIG. 6.

The split transmission will now be explained with reference to the timing chart shown in FIG. 8.

First, a row address Row a is input at the CLK signal CLK1 and data is transmitted to data register A or C. Then, at CLK3 the starting address Start i of the SAM is input, and serial data from this address is output from the SAM port.

During the output of 256 bits of data, the next row address b is input at CLK9, and data is transmitted to data register B or D. Then, at CLK11 the starting address j of the SAM is input, and serial data is output from the SAM port from the address j after the previous SAM data has all been output.

By carrying out split transmission alternately in this manner, serial data can be output continuously from the SAM port.

In this embodiment, control signals, address signals, and data are latched at the onset of the clock signal, but the present invention is not limited to this.

For example, it is possible to latch these signals using the fall, the rising, or both the rising and the fall.

In addition, both the RAM port and the SAM port are controlled using one basic clock signal.

However, these ports can be controlled using independent clock signals.

In addition, a block transmission method of 4-bit or 8-bit units in a serial register was explained as a high speed data transmission method, but there is also a method of transmitting data by interleaving clock signals.

As explained above, by using the circuit configuration and the control method of the semiconductor memory device for storing graphics data of the present invention, both the RAM port and the SAM port can be operated at high speed.

For example, it is possible to provide a semiconductor memory device for storing graphics data operating at over than 100 MHz. Also, it is not necessary to control using the critical timing associated with an external control signal. It is possible to input all the control signals synchronously with the onset of the basic clock signal.

Furthermore, the inner control of the device can also be operated in synchronism with the clock signals, so that control is simple and it is possible to attain a high speed operation simultaneously.

Also, by providing an internal counting section, the internal operation is controlled based on the number of cycles, so that complicated circuits such as delay circuits and the like which are required for conventional semiconductor memory device for storing graphics are unnecessary, thus simplifying the design of the circuits.

The scope of the present invention is not limited to the embodiments described above, but includes many variations that will be obvious to one skilled in the art, and may be modified and changed without departing from tile scope and spirit of the present invention.

What is claimed is:

1. A semiconductor memory device, comprising:
a memory cell array arranged in matrix form comprising a plurality of memory cells;
first data input/output (I/O) means for implementing random input and output of data for one of the memory cells based on an externally-supplied random I/O signal;
second data I/O means for implementing serial input and output of the data for the memory cell;
counter means for counting the number of cycles of a basic clock signal externally-supplied; and
control means for controlling the I/O of the data for the memory cell in accordance with the number of the cycles of the basic clock signal,
inputting at least one or more types of designation signals externally supplied,
generating a designation control signal for designating a specified cycle which is a count starting cycle for the basic clock signal at each of the designation signals,
generating instructions for starting count of the number of cycles of the basic clock signal in the counter means based on the designated control signal, and
synchronously controlling designation of addresses based on the number of cycles of the basic clock signal counted by the counter means and the I/O operations of the first data I/O means and the second data I/O means from the specified cycle of the designated basic clock signal.

2. A semiconductor memory device, comprising:
a memory cell array arranged in matrix form comprising a plurality of memory cells;
address designation means for selecting a specified memory cell in the memory cell array;
first data input/output (I/O) means for executing random input and output of data for the memory cell designated by the address designation means based on a random I/O control signal externally-supplied;
a first I/O port for random input and output between the data in the first data I/O means and external data, performing in synchronism with a basic clock signal externally and continuously supplied;
a serial data register for temporarily storing the data to input and output the data for the memory cell array;
transfer means for transferring the data in the memory cell array designated by the address designation means to the serial data register, based on an externally-supplied serial transmission control signal;

second data I/O means for executing serial input and output of the data in the serial data register;

a second I/O port for serial input and output between data in the second data I/O means and external data, performing in synchronism with the basic clock signal;

counter means for counting the number of cycles of the basic clock signal; and control means for controlling the I/O of the data for the memory cell in accordance with the number of cycles of the basic clock signal, inputting at least one or more types of designation signals externally supplied, generating a designation control signal for designating a specified cycle which is a count starting cycle for the basic clock signal at each of the designation signals, generating instructions for starting count of the number of cycles of the basic clock signal in the counter means based on the designated control signal, and synchronously controlling designation of addresses by the address designation means based on the number of cycles counted by the counter means and the I/O operations of the first and second data I/O means from the specified cycle of the designated basic clock signal.

3. A semiconductor memory device as claimed in claim 2, wherein the memory cell array is divided into a plurality of banks, each bank comprising a plurality of memory cells;

each of the banks comprises a serial data register and a second data I/O means; and the control means switches the banks so that while one bank is undergoing an I/O operation, another bank is being precharged, and so that a split transmission of data I/O is carried out between the banks.

4. A semiconductor memory device as claimed in claim 2, wherein the basic clock signal is formed from two types of clock signals, and the control means allows the first I/O port to be operated in synchronism with one clock signal, and the second I/O port to be operated in synchronism with another clock signal.

5. A semiconductor memory device as claimed in claim 1, wherein the control mens controls independently the I/O operations of the first data I/O means and the second data I/O means based on control signals transmitted from the control means.

* * * * *